US006873202B1

(12) United States Patent
Lin

(10) Patent No.: US 6,873,202 B1
(45) Date of Patent: Mar. 29, 2005

(54) ADAPTIVE MOSFET RESISTOR

(75) Inventor: Hung Chang Lin, Silver Spring, MD (US)

(73) Assignee: Maryland Semiconductor, Inc., Clarksburg, MD (US)

(*) Notice: Subject to any disclaimer, the term of this patent is extended or adjusted under 35 U.S.C. 154(b) by 0 days.

(21) Appl. No.: 10/688,437

(22) Filed: Oct. 20, 2003

(51) Int. Cl.[7] .............................................. H03K 17/60
(52) U.S. Cl. ...................................... 327/432; 330/296
(58) Field of Search ................................. 327/427, 431, 327/432, 433, 463, 473, 478; 330/261, 273, 296, 300

(56) References Cited

U.S. PATENT DOCUMENTS

| | | | | |
|---|---|---|---|---|
| 4,492,883 A | * | 1/1985 | Janutka | ...................... 327/377 |
| 4,553,108 A | * | 11/1985 | Young | ......................... 330/300 |
| 5,014,102 A | * | 5/1991 | Adler | ........................... 257/139 |
| 5,712,588 A | * | 1/1998 | Choi et al. | ................... 327/525 |

* cited by examiner

Primary Examiner—Tuan T. Lam
(74) Attorney, Agent, or Firm—H. C. Lin, Patent Agent

(57) ABSTRACT

A MOSFET can operate as a resistor by operating in the linear or ohmic region of the drain V-I characteristics. This region can be obtained by floating the gate of the MOSFET, when the dc current and the voltage drop are given. Multiple resistors can be duplicated (or mirrored) by sharing the same source and floating gate. The floating gate voltage can be simulated using a closed loop equivalent circuit. Alternatively, the gate voltage can also be derived from the given drain-to-source voltage and the given current in a feedback loop. With this adaptive MOSFET resistor, the minimum supply voltage can be as low as the sum of the BJT threshold and the complementary BJT saturation voltage, e.g. $V_{CC} \geq V_{BE}+V\text{sat}$ (e.g. 0.8+0.15<1.0V). The threshold voltage Vt should be less than $V_{BE}$.

13 Claims, 2 Drawing Sheets

ADAPTIVE MOSFET RESISTOR

BACKGROUND OF THE INVENTION

1. Field of the Invention

This invention relates bipolar-junction transistor (BJT)/MOSFET integrated circuit, particularly to resistive means to bias a BJT with a MOSFET.

2. Brief Description of Related Art

In integrated circuits, a polycrystalline film or diffusion is often used to fabricate resistors. Such resistors are limited in range of resistance values and may occupy substantial areas. Although it is well-known that a MOSFET can operate as a resistor in its ohmic or "triode" region of its drain V-I characteristics, it is seldom used in practice, because the resistance value varies with the gate voltage.

In circuit applications, a resistor is used to determine the current flow across a voltage differential, for instance between the supply voltage and an electrode of a transistor. For a BJT common emitter amplifier as shown in FIG. 1a, once the dc collector current $I_{C1}$ is chosen, the dc base current $I_B$ must be $1/\beta$ times less. Normally, the value of beta varies over a wide range in any production line, and if $I_B$ is fed from a positive power supply through a resistor $R_B$ to the base of an NPN transistor, the resistance value must vary accordingly. Besides, the base resistance value may be too low to shunt the input signal Vin coupled to the base. If the collector is fed through an inductive load, there is no dc voltage drop the load and the minimum required $V_{CC}$ is the sum of dc base-to-emitter voltage $V_{BE}$ and the drop across the $R_B$.

If the dc base current is supply from a current mirror as shown in FIG. 1b, the effective beta is reduced, and the input resistance is further reduced to shunt the input signal Vin.

In another instance as shown in FIG. 1c, it is desired to operate Q1 at a specified collector current $I_{C1}$. Then the base current $I_B$ should be equal $I_{C1}/\beta$. This base current can be derived from the reference base current of Q3 through current mirrors Q2,Q2', where Q3 is fed from a current source with current mirror Q4, Q4'. A current mirror usually has a master section e.g. Q2' and Q4' and a slave section e.g. Q2 and Q4. The dc collector-to-emitter voltage of the master section with the base shorted to the collector must be equal to the turn-on voltage of the BJT, typically in the 0.7V–0.8 V range. The dc collector-to-emitter voltage of the slave section need not be as large, so long as the BJT operates in the active region typically >0.1–0.2V. The dc supply voltage must at least allow enough headroom $V_{CE4}$ (<0.2V) for the current source Q4, the base-to-emitter voltage $V_{BE3}$ (>0.7V) of the reference BJT Q3 and the base-to-emitter voltage $V_{CE2'}$ (>0.7) of the current mirror Q2' for a total of more than 1.5 V. For a standard battery, the rated voltage is 1.5 V new, and for a mercury cell, the voltage is only 1.3V new. For low voltage application, it is desirable to operate the circuit below 1.3V. Thus the circuit shown in FIG. 1c needs at least a supply voltage $V_{CC}$ higher than $V_{CE4}(>0.2V)+V_{BE3}(>0.7V)+V_{CE2'}(>0.7V)>1.6V$, which is not suitable for single battery low voltage operation.

SUMMARY OF THE INVENTION

It is proposed here to use an adaptive gate MOSFET to serve as an ohmic resistor by operating the MOSFET is the linear region of the drain characteristics. The proposed adaptive gate MOSFET is to achieve the following objects:

to adapt to a wide range of resistance value for any specified current and voltage drop;

to require lower voltage drop than a current mirror, hence low supply voltage;

to mirror the resistance to more than one resistance values;

to float the gate of the MOSFET to adapt to the voltage across the resistor and the current through the resistor;

to reduce the area occupied by the resistors in an IC.

These objects are achieved by using a MOSFET operating in the ohmic region of the drain V-I characteristic to bias the base of a BJT. The gate voltage of the MOSFET is adaptable, so the MOSFET resistor feeds the correct amount of dc base current to yield a desired dc collector current over a wide range of current amplification factor $\beta$. The adaptive gate voltage can be obtained by deriving the gate voltage from a current regulator or simply floating the gate.

BRIEF DESCRIPTION OF THE DRAWINGS

FIG. 5b shows channel stops for the structure of FIG. 5a.

DETAILED DESCRIPTION OF THE INVENTION

Figure 2A:
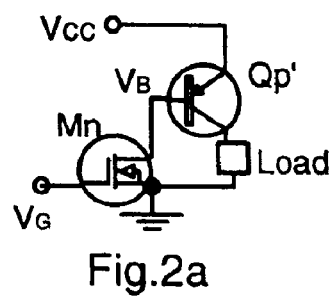
FIG. 2a shows a MOSFET serving as a base biasing resistor for a pnp transistor.
Figure 2B:
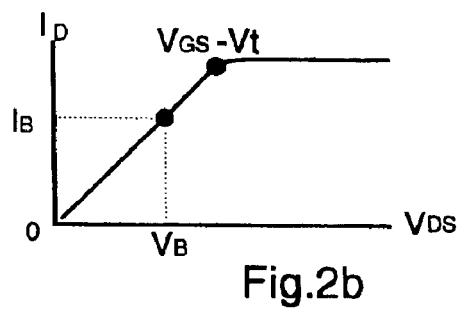
FIG. 2b shows the operating point of the MOSFET resistor.

Operation of the MOSFET Resistor:

FIG. 2a shows the use of a n-channel MOSFET Mn as a base resistor for biasing a pnp BJT Qp of a common emitter amplifier. The dc drain characteristic is shown in FIG. 2b. The current $I_D$ of a MOSFET is given as:

$$I_D = kp(W/L)[(V_{GS}-Vt)V_{DS}-V_{DS}^2/2] \quad (1)$$

where kp is a transconductance parameter, W/L is the width-to-length ratio of the gate, $V_{GS}$ is the gate to source voltage, Vt is the threshold voltage and $V_{DS}$ is drain-to-source voltage. When $V_{DS}$ is less than $(V_{GS}-Vt)$, the MOSFET is operating in the ohmic region, and $$I_C \approx kp(W/L)(V_{GS}-Vt)V_{DS} \quad (2)$$

The ohmic resistance is:

$$R_{DS}=V_{DS}/I_C=1/[kp(V_{GS}-Vt)] \quad (3)$$

By adjusting $V_{GS}$, a wide range of resistance values can be obtained, so long as $V_{DS}$ is less than $(V_{GS}-Vt)$.

Figure 1C:
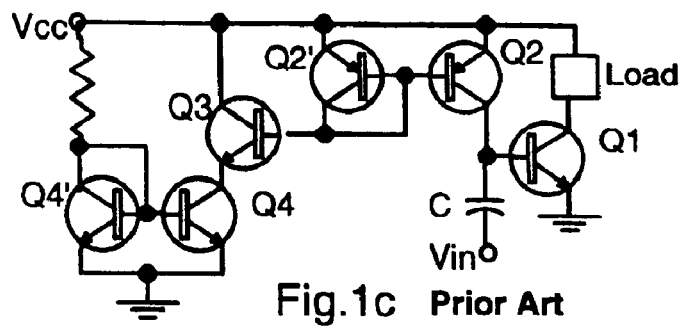
Figure 2C:
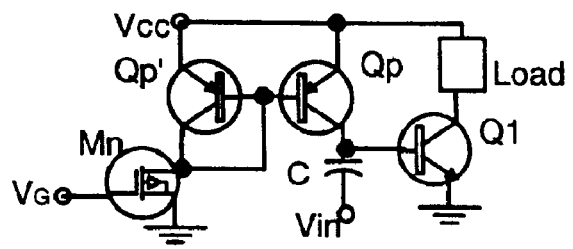
FIG. 2c shows a MOSFET resistor biasing a pnp current mirror for feeding a base current to an npn common emitter amplifier.

FIG. 2c shows the use of Qp' similar to the pnp amplifier shown in FIG. 2a as the master section of a current mirror fed from the MOSFET resistor Mn. The slave section Qp mirrors the current through Mn to the master section Qp'. The gate voltage $V_G$ is adjusted to flow in Mn a current equal to $1/\beta$ that of the desired $I_C$ for Q1. As compared to FIG. 1c, FIG. 2c has one less $V_{BE3} \sim 0.7V$ headroom in Q3 and the supply voltage can be as low as the sum of $V_{BE1}+V_{CE2knee}<1V$, where the voltage drop across Mn can be as low as the knee voltage of Q2.

Design of the Adaptive MOSFET Resistor:

Consider the pnp common emitter circuit FIG. 2a with the base of Qp' fed from a nMOS resistor Mn with a gate voltage $V_G$. The operating point of Mn is shown in FIG. 2b. The supply voltage $V_{CC} \gtrsim V_{BE} + V_B$). For common emitter npn amplifier Q1 as shown in FIG. 2c, the base is preferably fed from a current source Qp operating in the active region (i.e. above the knee $V_{knee}$ of the collector characteristic ~0.15V). Thus the minimum supply voltage $V_{CC} = (V_{BE} + V_{knee}) = 0.8 + 0.15 = 0.95V$. When the current source Qp is mirrored from a master pnp Qp', the operation of Qp' is similar to that in FIG. 2a with $V_B = 0.15V$. For the ohmic operation of the MOSFET resistor shown in FIG. 2a, the dc voltage across of the MOSFET should operate at a $V_{DS}$ less than the knee voltage, i.e.

$$V_B = (V_{CC} - V_{BE}) < (V_G - Vt) \quad (4)$$

$$\text{or } (V_{CC} - V_{BE} + Vt) < V_G \quad (5)$$

$$\text{Since } V_{CC} > V_G \quad (6)$$

Combining (5) and (6) yields:

$$V_{BE} > Vt \quad (7)$$

For $I_B > 0$, $V_B > 0$, as shown in FIG. 2. For The minimum $V_B$ can be obtained from the following consideration: Since the base of the BJT is the signal input terminal of a common emitter amplifier, the base should preferably be fed from a high impedance current source as shown in FIG. 2c, instead of the low ohmic resistance of MOSFET to avoid shunting the signal. The minimum voltage across a current source Qp should be higher that the saturation voltage Vsat, typically ~0.15V. Thus, the minimum supply voltage is:

$$V_{CC} > (V_{BE} + Vsat) = 0.8 + 0.15 = 0.95V$$

The current source Qp is mirrored from the master BJT Qp', which is fed from an adaptable MOSFET resistor Mn described above.

The size of the MOSFET resistance can be calculated as follows:

$$I_B = I_C/\beta = I_D = kp(W/L)(V_{CC} - V_G - Vt)(V_{CC} - V_B) \quad (8)$$

$$W/L = (I_C/\beta)/[kp(V_{CC} - V_G - V)(V_{CC} - V_B)] \quad (9)$$

A medium value of gate voltage can be derived from Eq. (5), $$V_G = (V_{CC} - V_B)/2 \quad (10)$$

This medium $V_G$ can allow a $I_C/\beta$ variation twice that of the medium value.

Figure 1A:
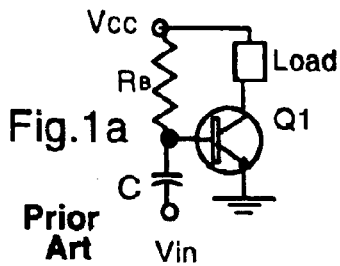
FIGS. 1a,b,c show prior art means for biasing a BJT common-emitter amplifier.
Figure 1B:
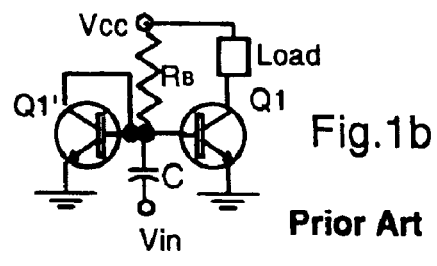
Figure 3:
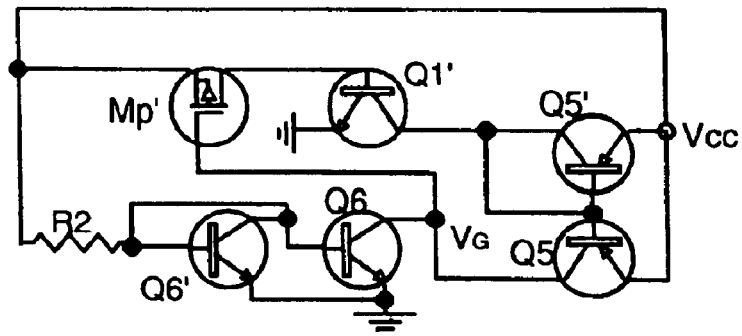
FIG. 3 shows a base current regulating circuit for deriving an adaptable gate voltage to the MOSFET resistor to bias the base of a BJT.

Derivation of the Gate Voltage:

The gate voltage for the MOSFET resistor can be obtained as follows: The gate voltage can be derived with a regulator circuit as shown in FIG. 3. Consider a complementary circuit of FIG. 2a, where a pMOS Mp' is used to drive the base of an npn BJT Q1', which is identical to Q1 in FIGS. 1a–c. The MOSFET Mp' corresponding $R_B$ in FIG. 1a is connected between supply $V_{CC}$ and the base of BJT Q1' corresponding to Q1. The collector of Q1' is connected to a current mirror Q5, Q5', which mirrors the collector current of Q1'. The mirror current out of Q5 is compared with the desired collector current for Q1 as a reference current Iref from a current mirror Q6,Q6'. An error voltage $V_G$ is developed and applied to the gate of Mp'. The feedback loop regulates the base current Q1' to yield the desired reference emitter current Iref. Then $V_G$ is the adaptive gate voltage.

Figures 4A, 4B:
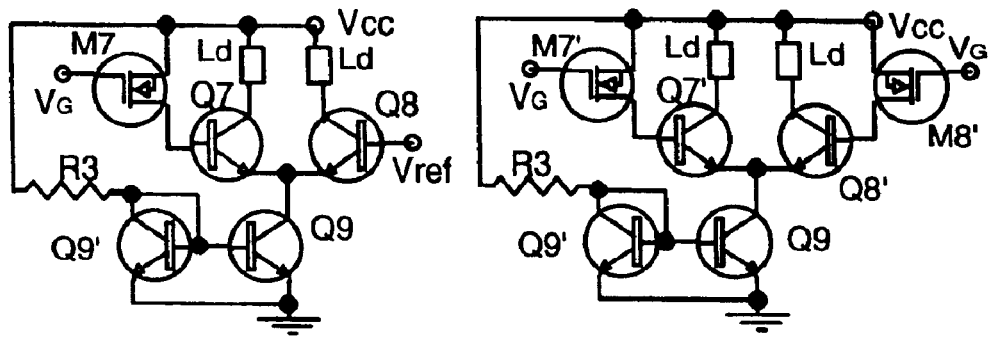
FIG. 4a shows a MOSFET resistor for biasing the base of a BJT differential pair.
FIG. 4b shows two MOSFET resistor for biasing two bases of a BJT differential pair.

Floating Gate Operation:

When the voltage across the MOSFET resistor and the current are known, there is only one gate voltage for the MOSFET resistor to satisfy this condition. Thus, if the voltage across the MOSFET is given and the current is given, the gate automatically adjusts itself, even if it is floating. This feature can sometimes be utilized as illustrated in FIGS. 4a,4b. When the gate of the MOSFET is floating, and $V_{DS}$ and $I_C$ are given, then $V_{GS}$ must assume a value to satisfy Eq. (3). Therefore, the resistance value is adaptive.

A circuit to demonstrate this floating gate resistor is shown in FIG. 4a. An npn differential pair Q7, Q8 is fed from a current source Io. The base of Q8 is fixed at dc voltage $V_{Ref}$. For balanced operation, the dc base voltage of Q7 must be equal to that of Q8, i.e. $V_{Ref}$, and the dc base currents $I_{B7}$ and $I_{B8}$ must be equal to $Io/2(1+\beta)$. Since the dc base current $I_{B7}$ and the dc base voltage are known, the base of Q6 can be fed from a floating gate MOSFET M7 as a resistor. The floating gate of M7 automatically assumes a resistance value for the appropriate base current for Q7.

This resistance can be duplicated (mirrored) in other resistors on the same chip. For instance in FIG. 4b, there is another differential pair Q7', Q8' similar to Q7, Q8 in FIG. 4a, fed from a similar current source Io. The base biasing resistors can be duplicated by two MOSFET resistors M7', M8' identical to M7. If the current source is different from Io, say 2Io, In such a case, the resistance M8' feeding the base should be doubled. This can be done by doubling the W/L ratio of M8' as compared the W/L ratio of M8. For the differential pairs in FIGS. 4a, 4b, one more headroom for Q9 than that in FIG. 2c is required, i.e. $V_{CE9} + 1.0V < 1.2V$.

If the values of the MOSFET resistors shown in FIGS. 4a,4c are too low to shunt the input signals, the techniques shown in FIG. 2c can be used.

To simulate the floating MOSFET, a dc gate voltage must be assigned to the floating gate. In a typical simulation program such as SPICE, the program does not run with the gate floating. The floating gate voltage can be derived from the regulated gate voltage derived from FIG. 3.

Figure 5A:
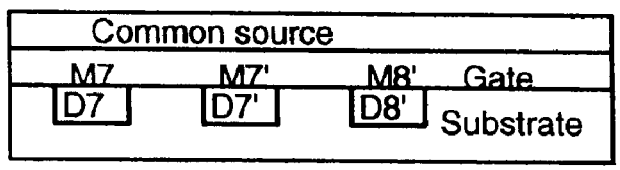
FIG. 5a shows common source and common gate MOSFET resistor mirrors.
Figure 5B:
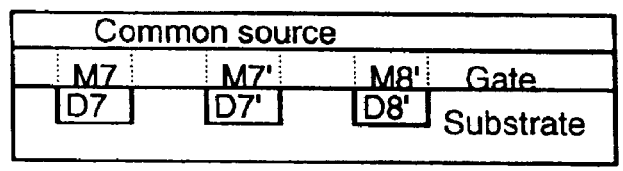

Layout of the Floating Gate Resistor:

The floating gate MOSFETs such as M7, M8' can share a common source and a common floating gate, but different drains D7, D7', D8'. A layout is shown in FIG. 5a. Such a layout can save area. To prevent cross-talks among the different floating gate MOSFETs, the different MOSFETs can be separated to each other by channel stops shown in dotted lines in FIG. 5b as is well known in the IC art. The floating gate should be sealed in oxide and not connected to any parts of the circuit to prevent leakage.

In the foregoing descriptions of the current mirrors in FIGS. 1c, 2c, 3, 4a and 4b, it is implied that the currents in the master sections are the same as that in the slave sections. However, the currents in the master sections can be reduced by reducing the emitter sizes of the master sections as is well known in the current mirror art. Also, the BJT current mirrors in these circuits can be replaced with corresponding MOSFETs, i.e. pMOS for pnp BJTs and nMOS for npn BJTs.

While the preferred embodiments of the invention have been described, it will be apparent to those skilled in the art that various modifications can be made without departing the spirit of the present invention. Such modifications are all within the scope of the present invention.

What is claimed is:

1. An ohmic resistor comprising:
   MOSFET having a drain, a source and a gate;
   a dc voltage applied across said MOSFET between said drain and said source;

a dc drain current flowing from the drain to the source; and an adaptive gate voltage appearing automatically at said gate such that the MOSFET operates in the ohmic region of the drain V-I characteristic.

2. The ohmic resistor as described in claim 1, wherein nothing is connected to said gate.

3. The ohmic resistor as described in claim 2, further comprising resistance mirror to mirror the resistance of said ohmic resistance, comprising:

more than one MOSFETs having a common source, a common floating gate and separate drains.

4. The ohmic resistor as described in claim 3, wherein said drains are connected to separate load devices.

5. The ohmic resistor as described in claim 3, wherein the channels of said MOSFETs are isolated from each other with channel stoppers.

6. The ohmic resistor as described in claim 1, wherein the drain of said MOSFET is connected to the base of a complementary type bipolar junction transistor, operating as a common emitter amplifier.

7. The ohmic resistor as described in claim 1, wherein said MOSFET is an nMOS having a drain connected to a pnp BJT current mirror and the output of the current mirror driving the base of an npn common emitter amplifier.

8. The ohmic resistor as described in claim as described in claim 1, wherein said ohmic resistor is connected to the first base of a BJT differential pair fed from a current source, and a reference voltage connected to the second base of said differential pair.

9. The ohmic resistor as described in claim 6 further comprising additional BJT differential pairs having said ohmic resistor connected to each base of said additional differential pairs.

10. The ohmic resistor as described in claim 5, wherein the width ratio of the separate drains is varied to vary inversely the resistance ratio of the resistance mirror.

11. The ohmic resistor as described in claim 1, wherein said gate is applied with a regulating gate voltage derived from said drain-to-source voltage and said drain current so as to satisfy the drain voltage vs current characteristic of a MOSFET.

12. The ohmic resistor as described in claim 11, wherein said regulating gate voltage is derived from a feedback loop.

13. The ohmic resistor as described in claim 12, wherein the source current from the MOSFET applied with a specified dc drain-to source voltage is compared with a reference source current and a compared error output voltage is fed back to the gate of the MOSFET to constitute said adaptive gate voltage for regulating the source current from said MOSFET and the reference source current to be equal.

* * * * *